(12) United States Patent
Liu et al.

(10) Patent No.: US 9,812,326 B2
(45) Date of Patent: Nov. 7, 2017

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Guoan Liu, Shanghai (CN); Wei Xu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/989,169

(22) Filed: Jan. 6, 2016

(65) Prior Publication Data
US 2016/0204050 A1     Jul. 14, 2016

(30) Foreign Application Priority Data
Jan. 14, 2015  (CN) .......................... 2015 1 0019320

(51) Int. Cl.
| | |
|---|---|
| H01L 21/18 | (2006.01) |
| B81C 1/00 | (2006.01) |
| H01L 25/065 | (2006.01) |
| H01L 25/00 | (2006.01) |
| H01L 23/48 | (2006.01) |

(52) U.S. Cl.
CPC .............. *H01L 21/187* (2013.01); *B81C 1/00* (2013.01); *H01L 25/0657* (2013.01); *H01L 25/50* (2013.01); *H01L 23/481* (2013.01); *H01L 2224/13* (2013.01); *H01L 2225/06513* (2013.01); *H01L 2225/06541* (2013.01); *H01L 2924/0002* (2013.01)

(58) Field of Classification Search
CPC . H01L 21/187; H01L 23/481; H01L 2224/13; H01L 2924/0002; B81C 1/00
See application file for complete search history.

(56) References Cited

U.S. PATENT DOCUMENTS

| | | | |
|---|---|---|---|
| 9,108,840 B2* | 8/2015 | Wang ................. | B81C 1/00246 |
| 9,290,376 B1* | 3/2016 | Cheng ................ | H01L 27/12 |
| 2016/0137492 A1* | 5/2016 | Cheng ................ | B81C 1/00238 |
| | | | 257/415 |

* cited by examiner

*Primary Examiner* — David Vu
(74) *Attorney, Agent, or Firm* — Innovation Counsel LLP

(57) ABSTRACT

A method for manufacturing a semiconductor device may include the following steps: preparing a first substrate; providing a first conductor, which is configured to electrically connect two elements associated with the first substrate; providing a second conductor on the first substrate, wherein the second conductor is electrically connected to the first conductor; preparing a second substrate; providing a third conductor, which is configured to electrically connect two elements associated with the second substrate; providing a fourth conductor on the second substrate, wherein the fourth conductor is electrically connected to the third conductor; providing a fifth conductor on the fourth conductor; and combining the fifth conductor with the second conductor through eutectic bonding.

10 Claims, 5 Drawing Sheets

US 9,812,326 B2

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201510019320.6, filed on 14 Jan. 2015; the Chinese Patent Application is incorporated herein by reference in its entirety.

BACKGROUND

The technical field is related to a semiconductor device, a method for manufacturing the semiconductor device, and an electronic device that includes the semiconductor device.

A method for manufacturing a semiconductor device may include the following steps: electrically connecting elements in a first substrate with elements in a second substrate using one or more interposers and one or more bonding wires; and providing a plastic package for enclosing the first substrate and the second substrate. The interposer(s) and/or the bonding wire(s) may undesirably add to a size and/or a cost associated with the semiconductor device.

SUMMARY

An embodiment may be related to a method for manufacturing a semiconductor device. The method may include the following steps: preparing a first substrate; providing a first conductor, which is configured to electrically connect two elements associated with the first substrate; providing a second conductor on the first substrate, wherein the second conductor is electrically connected to the first conductor; preparing a second substrate; providing a third conductor, which is configured to electrically connect two elements associated with the second substrate; providing a fourth conductor on the second substrate, wherein the fourth conductor is electrically connected to the third conductor; providing a fifth conductor on the fourth conductor; and combining the fifth conductor with the second conductor using an eutectic bonding process.

The method may include forming a wafer structure, which may include the first substrate, the first conductor, a third substrate, and a dielectric layer. The dielectric layer may be positioned between the first substrate and the third substrate. The first conductor may be positioned in the dielectric layer. The dielectric layer may be combined with at least one of the first substrate and the third substrate using a fusion bonding process.

The method may include the following steps: providing the first conductor on the first substrate; providing the dielectric layer on the first substrate such that the dielectric layer covers the first conductor; and combining the dielectric layer with the third substrate through fusion bonding.

The method may include the following steps: providing the first conductor on the third substrate; providing the dielectric layer on the third substrate such that the dielectric layer covers the first conductor; and combining the dielectric layer with the first substrate through fusion bonding.

The method may include the following steps: providing a sixth conductor, which may extend through the first substrate and may directly contact the first conductor; and forming the second conductor to directly contact the sixth conductor.

Each of the sixth conductor and the first substrate may be positioned between the first conductor and the second conductor. The second conductor may be wider than the sixth conductor in a direction parallel to the first substrate and may be narrower than the first conductor in the direction parallel to the first substrate.

The first substrate may be positioned between the first conductor and the second conductor. The third conductor may be positioned between the second substrate and the fourth conductor. The method may include the following steps: providing a polymer layer on the second substrate, wherein the second substrate may be positioned between the third conductor and the dielectric layer; and providing a sixth conductor, which may be electrically connected to the fourth conductor, may be partially positioned in the polymer layer, and protrudes beyond the polymer layer. The method may include reducing a thickness of the second substrate before the providing the dielectric layer.

The second conductor may have a first ring structure. The fifth conductor may have a second ring structure.

A material of the fifth conductor may be different from each of a material of the second conductor and a material of the fourth conductor. The material of the second conductor may be identical to the material of the fourth conductor.

An embodiment may be related to a semiconductor device. The semiconductor device may include the following elements: a first substrate; a second substrate, which may overlap the first substrate; a first conductor, which may be configured to electrically connect two elements associated with the first substrate; a second conductor, which may be positioned on the first substrate and may be electrically connected to the first conductor; a third conductor, which may be configured to electrically connect two elements associated with the second substrate; a fourth conductor which may be positioned on the second substrate and may be electrically connected to the third conductor; and a fifth conductor, which may directly contact each of the second conductor and the fourth conductor and may be positioned between the second conductor and the fourth conductor. The first substrate may be positioned between the second substrate and a third substrate.

A material of the fifth conductor may be different from each of a material of the second conductor and a material of the fourth conductor. The material of the second conductor may be identical to the material of the fourth conductor.

The semiconductor device may include the following elements: a sixth conductor, which may be positioned on the first substrate, wherein a material of the sixth conductor may be identical to a material of the second conductor; a seventh conductor, which may be positioned on the second substrate, wherein a material of the seventh conductor may be identical to a material of the fourth conductor; and an eighth conductor, which may directly contact each of the sixth conductor and the seventh conductor and may be positioned between the sixth conductor and the seventh conductor, wherein a material of the eighth conductor may be identical to a material of the fifth conductor. The semiconductor device may include a ninth conductor, which may be positioned inside the first substrate and may directly contact the sixth conductor.

The second conductor may have a first ring structure. The fifth conductor may have a second ring structure.

The semiconductor device may include a sixth conductor, which may extend through the first substrate, may directly contact each of the first conductor and the second conductor, and may be positioned between the first conductor and the second conductor. The second conductor may be wider than the sixth conductor in a direction parallel to the first substrate and may be narrower than the first conductor in the direction parallel to the first substrate.

The semiconductor device may include the following elements: a polymer layer, which may be positioned on the second substrate, wherein the second substrate may be positioned between the third conductor and the polymer layer; and a sixth conductor, which may be electrically connected to the fourth conductor, may be partially positioned in the polymer layer, and protrudes beyond the polymer layer.

An embodiment may be related to an electronic device. The electronic device may include an electronic component and a semiconductor device. The semiconductor device may be electrically connected to the electronic component and may have one or more of the aforementioned features.

According to embodiments, in a semiconductor device, a set of conductive members may be configured for both bonding substrates and enabling electrical connections between elements of the substrates. Advantageously, a size and/or a cost associated with the semiconductor device may be substantially minimized.

The above summary is related to some of many embodiments disclosed herein and is not intended to limit the scope of embodiments.

BRIEF DESCRIPTION OF THE DRAWINGS

FIG. 6 shows a schematic diagram (e.g., a schematic cross-sectional view) that illustrates elements and/or structures in a semiconductor device in accordance with one or more embodiments.

DETAILED DESCRIPTION

Figure 1:
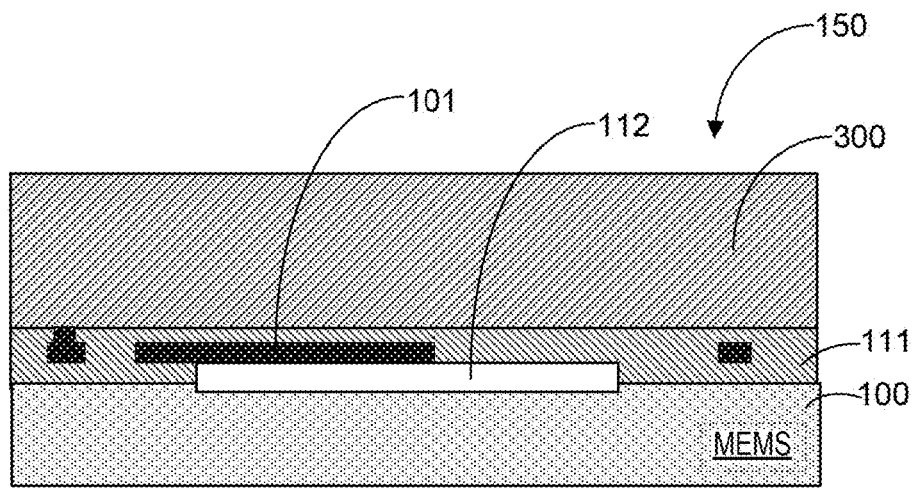
FIG. 1, FIG. 2, FIG. 3, FIG. 4, FIG. 5, and FIG. 6 show schematic diagrams (e.g., schematic cross-sectional views) that illustrate elements and/or structures formed in a method for manufacturing a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 4:
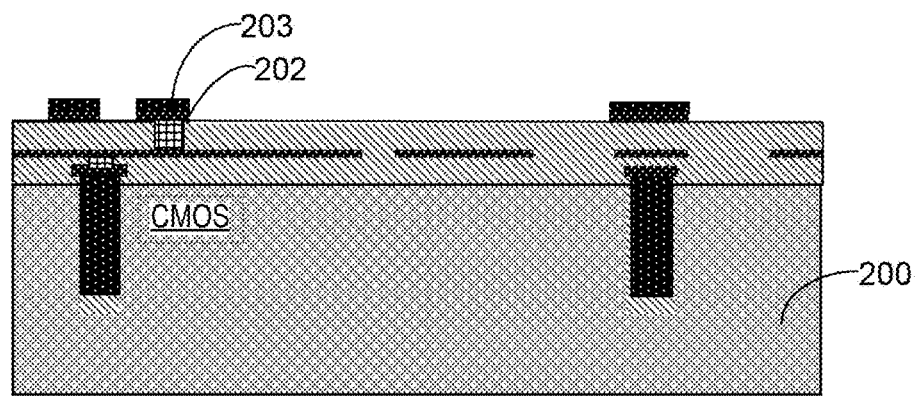
Figure 5:
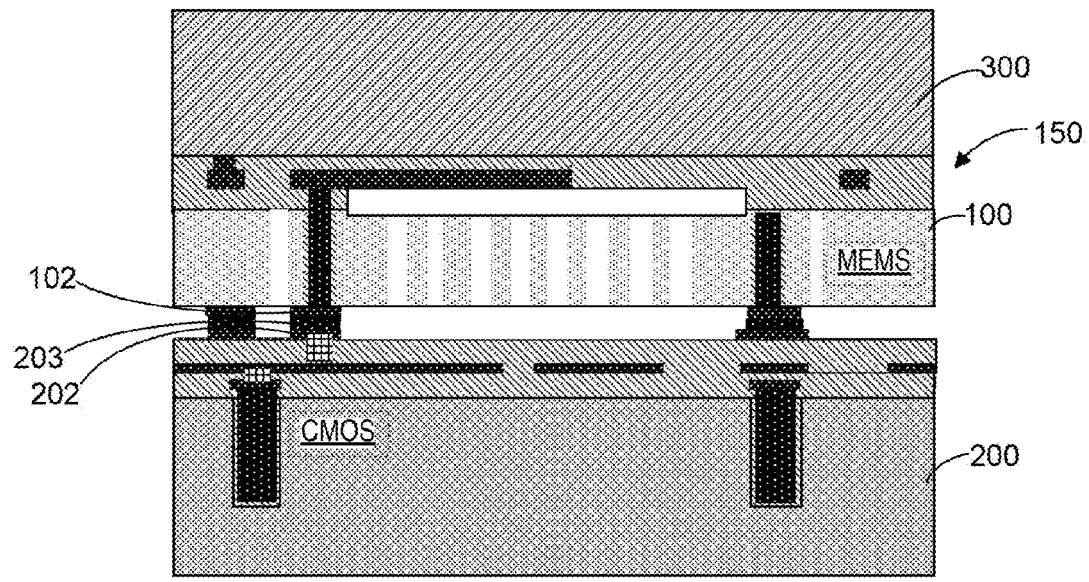
Figure 6:
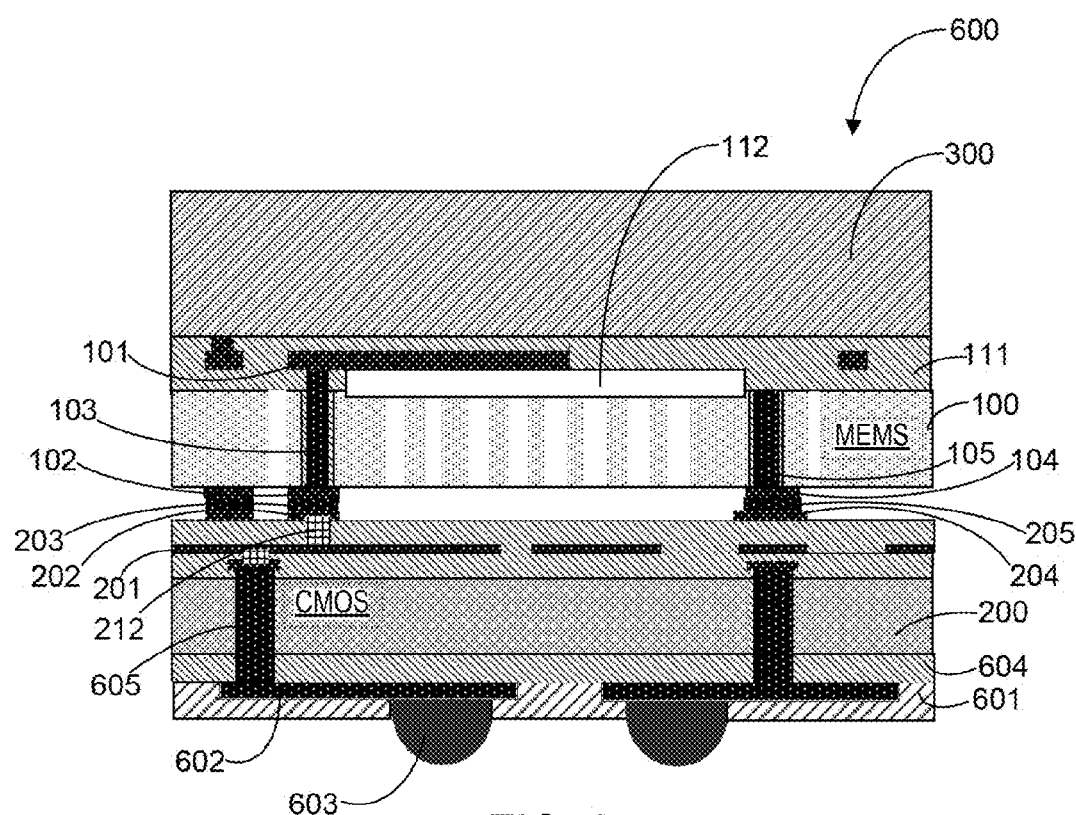
Figure 7:
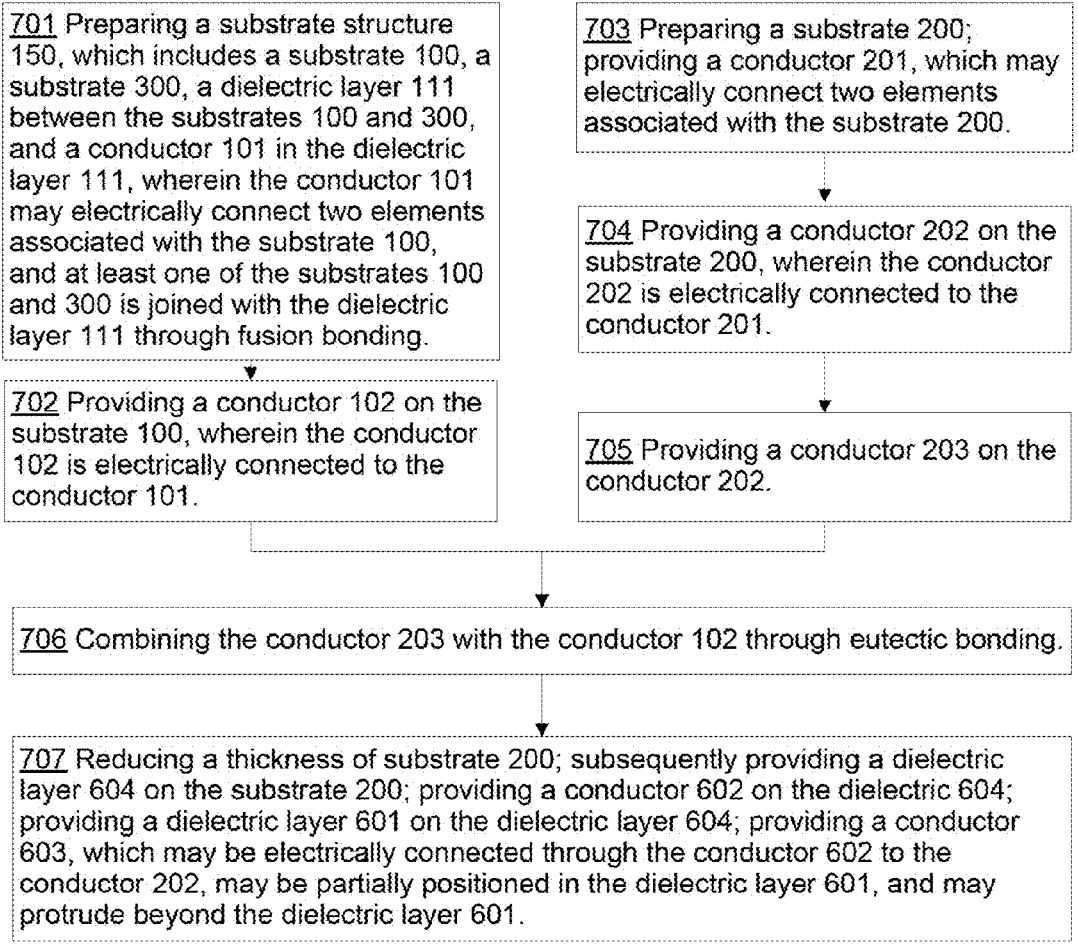
FIG. 7 shows a flowchart that illustrates steps in a method for manufacturing a semiconductor device in accordance with one or more embodiments of the present invention.

FIG. 1, FIG. 2, FIG. 3, FIG. 4, FIG. 5, and FIG. 6 show schematic diagrams (e.g., schematic cross-sectional views) that illustrate elements and/or structures formed in a method for manufacturing a semiconductor device 600 in accordance with one or more embodiments. FIG. 6 shows a schematic diagram (e.g., a schematic cross-sectional view) that illustrates elements and/or structures in the semiconductor device 600 in accordance with one or more embodiments. FIG. 7 shows a flowchart that illustrates steps in a method for manufacturing the semiconductor 600 device in accordance with one or more embodiments of the present invention.

Referring to FIG. 7, the method may include steps 701, 702, 703, 704, 705, 706, and 707. Sequences of some of the steps may be changed according to different embodiments.

Referring to FIG. 7 and FIG. 1, the step 701 may include the following steps: preparing a substrate structure 150, which may include a substrate 100 and a conductor 101. The substrate 100 may include a semiconductor substrate (e.g., a silicon substrate) and one or more microelectromechanical system (MEMS) units positioned in the semiconductor substrate. The conductor 101 may be an interconnect member configured to electrically connect two or more elements associated with the substrate 100, such as two or more elements associated with the one or more MEMS units. The conductor 101 may be formed of aluminum (Al), copper (Cu), and/or one or more other suitable conductive materials.

The wafer structure 150 may further include a substrate 300 and a dielectric layer 111. The substrate 300 may be a low-resistivity silicon substrate. The dielectric layer may be a polyethylene oxide (PEOX) layer. The dielectric layer 111 may be positioned between the substrate 100 and the substrate 300. The conductor 101 may be positioned inside the dielectric layer 111. The dielectric layer 111 may be combined with at least one of the substrate 100 and the substrate 300 using a fusion bonding process and/or one or more other bonding suitable processes.

The method may include the following steps: providing the conductor 101 on the substrate 300; providing the dielectric layer 111 on the substrate 300 such that the dielectric layer 111 covers the conductor 101; and combining the dielectric layer 111 with the substrate 100 through fusion bonding.

The method may include the following steps: providing the conductor 101 on the substrate 100; providing the dielectric layer 111 on the substrate 100 such that the dielectric layer 111 covers the conductor 101; and combining the dielectric layer 111 with the substrate 300 through fusion bonding.

The method may include forming a cavity 112 in the combination of the substrate 100 and the dielectric layer 111. The cavity 112 may be positioned at a boundary of the substrate 100 and the dielectric layer 111. The cavity 112 may partially expose the conductor 101.

The method may include one or more of the following steps: providing contact holes in the substrate 100; providing connection lines in the substrate 100; trimming one or more edges of the substrate structure 150; reducing a thickness of the substrate 100; and reducing a thickness of the substrate 300. The substrate 300 may effectively seal and/or protect the one or more MEMS units.

Figure 2:
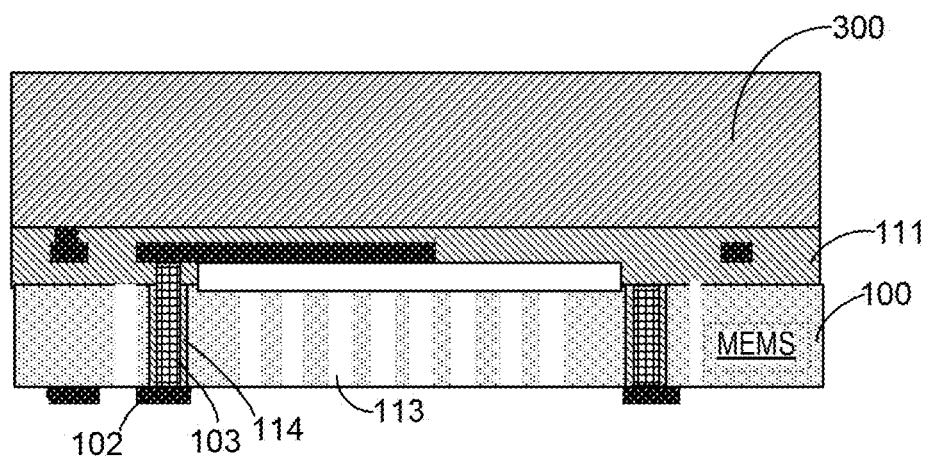

Referring to FIG. 7, FIG. 1, and FIG. 2, the step 702 may include providing a conductor 102 on the substrate 100, wherein the conductor 102 may be electrically connected to the conductor 101. The conductor 102 may be formed of aluminum (Al), copper (Cu), and/or one or more other suitable conductive materials. The conductor 102 may be formed through one or more of a deposition process, an etching process, etc. The conductor 102 may have a ring structure, for accommodating deformation of the conductor 102 in the subsequent eutectic bonding process.

The method may include the following steps: forming a contact hole through the substrate 100; providing an insulating layer 114 (e.g., a silicon oxide layer) on the inner wall of the contact hole; providing a conductor 103 in the contact hole and surrounded by the insulating layer 114, wherein the conductor 103 may extend through the substrate 100 and may directly contact the conductor 101; and forming the conductor 102 to directly contact the conductor 103. The conductor 103 may extend perpendicular to the conductor 101.

One or more other contact holes (e.g., a contact hole 113) may also be formed for accommodate one or more other conductors. The contact hole and/or the one or more other contact holes may be formed using an etching process, such as a deep reactive-ion etching (DRIE) process.

The method may include the following steps: depositing a conductive material in the contact hole; and performing a chemical mechanical polishing (CMP) process on the deposited conductive material to form the conductor 103. The conductor 103 may be formed of tungsten and/or one or more other suitable conductive materials.

Each of the conductor 103 and the substrate 100 may be positioned between the conductor 101 and the conductor 102. The conductor 102 may be wider than the conductor 103 in a direction parallel to the substrate 100 and may be narrower than the conductor 101 in the direction parallel to the substrate 100.

Figure 3:
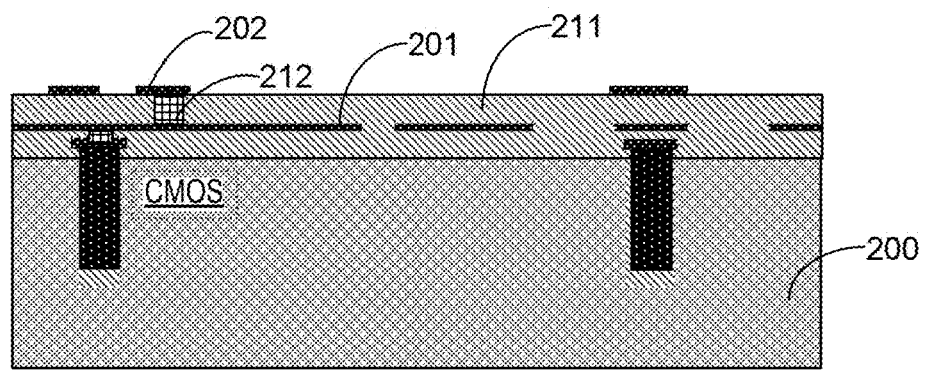

Referring to FIG. 7 and FIG. 3, the step 703 may include the following steps: preparing a substrate 200; and providing a conductor 201, which may electrically connect two elements associated with the substrate 200. The substrate 200 may include a semiconductor substrate, e.g., a silicon substrate, and one or more logic units, such as one or more complementary metal-oxide-semiconductor (CMOS) units. The conductor 201 may be an interconnect member configured to electrically connect two or more elements associated with the substrate 100, such as two or more elements associated with the one or more CMOS units. The conductor 201 may be formed of aluminum (Al), copper (Cu), and/or one or more other suitable conductive materials.

Referring to FIG. 7 and FIG. 3, the step 704 may include providing a conductor 202 on the substrate 200, wherein the conductor 202 may be electrically connected to the conductor 201. The conductor 202 may be a back-end-of-line (BEOL) element in the manufacturing process of the semiconductor device 600. The conductor 202 may belong to a sixth metal layer of the semiconductor device 600 or a sixth metal layer of the substrate 200. The conductor 202 may be formed of aluminum (Al), copper (Cu), and/or one or more other suitable conductive materials. The conductor 202 may be formed through one or more of a deposition process, an etching process, etc. The conductor may be connected through a conductor 212 to the conductor 201. The conductor 212 may be positioned inside a dielectric layer 211. The dielectric layer 211 may be positioned between the substrate 200 and the conductor 202. The conductor 201 may be positioned between the substrate 200 and the conductor 202 and may be positioned inside the dielectric layer 211.

Referring to FIG. 7 and FIG. 4, the step 705 may include providing a conductor 203 on the conductor 202. The conductor 203 may be formed of germanium (Ge), tin (Sn), and/or one or more other suitable conductive materials. The conductor 203 may have a ring structure, for accommodating deformation of the conductor 102 during the subsequent eutectic bonding process.

The method may include the following steps: growing a conductive material layer on the conductor 202 and the dielectric layer 211 in a tube furnace; and etching the conductive material layer to form the conductor 203 on the conductor 202.

A material of the conductor 203 may be different from each of a material of the conductor 102 and a material of the conductor 202. The material of the conductor 102 may be identical to the material of the conductor 202.

Referring to FIG. 7, FIG. 2, FIG. 4, and FIG. 5, the step 706 may include combining the conductor 203 with the conductor 102 using a eutectic bonding process. As a result, the substrate structure 150 may be connected to the substrate 200.

The conductor 102 may be formed of aluminum (Al), the conductor 203 may be formed of germanium (Ge), and the eutectic bonding process may be an Al—Ge eutectic bonding process. The conductor 202 may be formed of aluminum (Al), and the eutectic bonding process may be an Al—Ge—Al eutectic bonding process. The conductor 102 may be formed of copper (Cu), the conductor 203 may be formed of tin (Sn), and the eutectic bonding process may be a Cu—Sn eutectic bonding process.

In an embodiment, the conductor 203 may be first formed on the conductor 102 and then combined through eutectic bonding with the conductor 202. The conductor 202 may have a ring structure, for accommodating deformation of the conductor 202 in the eutectic bonding process.

The method may include the following step: before the eutectic bonding process, plasma-processing and then wet-cleaning one or more of the substrate structure 150, the substrate 100, the substrate 200, the conductor 102, the conductor 203, the conductor 202. The wet-cleaning process may involve using a dilute hydrogen fluoride (DHF) solution.

Referring to FIG. 7, FIG. 5, and FIG. 6, the step 707 may include the following steps: providing a conductor 605, which may extend through the substrate 200; providing a dielectric layer 604 on the substrate 200, wherein the substrate 200 may be positioned between the conductor 201 and the dielectric layer 604; providing a conductor 602 on the dielectric 604; providing a dielectric layer 601 on the dielectric layer 604 and the conductor 602 (and on the substrate 200), wherein the substrate 200 may be positioned between the conductor 201 and the dielectric layer 601; and providing a conductor 603, which may be electrically connected through the conductors 602, 605, 201, and 212 to the conductor 202, may be partially positioned in the dielectric layer 601, and may protrude beyond the dielectric layer 601. The method may include reducing a thickness of the substrate 200 before the providing the dielectric layer 604 and the dielectric layer 601.

One or more of the conductors may be formed of aluminum (Al), copper (Cu), and/or one or more other suitable conductive materials. The conductor 605 may be positioned in a through-silicon via (TSV) that extends through the substrate 200 and may extend perpendicular to the conductor 201 and/or the conductor 602. The conductor 602 may be a redistribution layer (RDL) element of the semiconductor device 600. A thickness of the conductor 602 may be about 8 microns. The conductor 603 may be a ball drop element of the semiconductor device 600.

The conductor 603 may be electrically connected through the conductors 602, 605, and 201 to an element related to the one or more logic units (e.g., one or more CMOS units) in the substrate 200. The conductor 603 may be electrically connected through the conductors 202, 203, 102, 103, and 101 to an element related to a MEMS unit in the substrate 100. The conductor 603 may electrically connect a MEMS element and/or a CMOS element of the semiconductor device 600 to an external device.

The dielectric layer 601 may be a polymer layer, e.g., a thermoset liquid crystalline polyoxazole material. The dielectric layer 601 may effectively insulate and/or protect conductors of the semiconductor device 600.

Referring to FIG. 6, the semiconductor device 600 may include the following elements: a substrate 100; a substrate 200, which may overlap the substrate 100; a conductor 101, which may be configured to electrically connect two elements associated with the substrate 100; a conductor 102, which may be positioned on the substrate 100 and may be electrically connected to the conductor 101; a conductor 201, which may be configured to electrically connect two elements associated with the substrate 200; a conductor 202 which may be positioned on the substrate 200 and may be electrically connected to the conductor 201; and a conductor 203, which may directly contact each of the conductor 102 and the conductor 202 and may be positioned between the conductor 102 and the conductor 202.

A material of the conductor 203 may be different from each of a material of the conductor 102 and a material of the conductor 202. The material of the conductor 102 may be identical to the material of the conductor 202.

The conductor 102 may have a first ring structure. The conductor 203 may have a second ring structure.

The semiconductor device 600 may include a conductor 104, which may be positioned on the substrate 100, may be spaced from the conductor 102, and may be form in the same process as the conductor 102. A material of the conductor 104 may be identical to a material of the conductor 102.

The semiconductor device 600 may include a conductor 204, which may be positioned on the substrate 200 may be spaced from the conductor 202, and may be form in the same process as the conductor 202. A material of the conductor 204 may be identical to a material of the conductor 202.

The semiconductor device 600 may include a conductor 205, which may be form in the same process as the conductor 203, may be spaced from the conductor 203, may directly contact each of the conductor 104 and the conductor 204, and may be positioned between the conductor 104 and the conductor 204. A material of the conductor 205 may be identical to a material of the conductor 203.

The semiconductor device 600 may include a conductor 105, which may be positioned inside the substrate 100 and may directly contact the conductor 104.

The semiconductor device 600 may include a conductor 103, which may extend through the substrate 100, may directly contact each of the conductor 101 and the conductor 102, and may be positioned between the conductor 101 and the conductor 102. The conductor 102 may be wider than the conductor 103 in a direction parallel to the substrate 100 and may be narrower than the conductor 101 in the direction parallel to the substrate 100.

The semiconductor device 600 may include the following elements: a dielectric layer 601, which may be positioned on the substrate 200, wherein the substrate 200 may be positioned between the conductor 201 and the dielectric layer 601; and a conductor 103, which may be electrically connected to the conductor 202, may be partially positioned in the dielectric layer 601, and may protrude beyond the dielectric layer 601.

According to embodiments, at least some of conductive members 102, 203, 202, 104, 205, and 204 may be used for both bonding the substrates 100 and 200 and enabling electrical connections between elements of the substrates 100 and 200. Advantageously, a size and/or a cost associated with the semiconductor device 600 may be substantially minimized.

According to embodiments, the substrate 300 and/or the dielectric layer 601 may effectively protect and/or insulate elements of the semiconductor device 600. Advantageously, satisfactory quality and/or reliability of the semiconductor device 600 may be attained.

Figure 8:
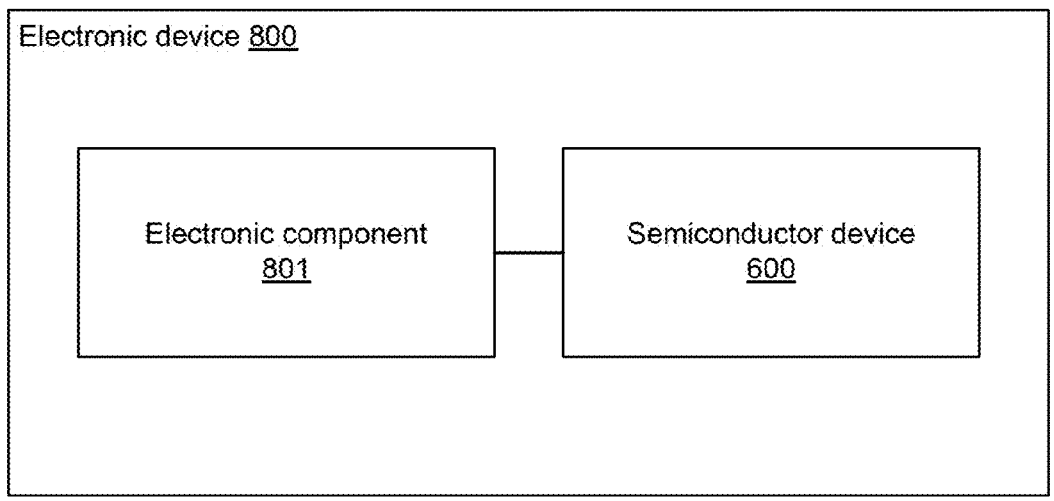
FIG. 8 shows a schematic block diagram that illustrates elements in an electronic device in accordance with one or more embodiments of the present invention.

FIG. 8 shows a schematic block diagram that illustrates elements in an electronic device 800 in accordance with one or more embodiments of the present invention. The electronic device 800 may include an electronic component 801 and a semiconductor device 600 that is electrically connected to the electronic component 801. The semiconductor device 600 may have one or more of the above-discussed features.

In an embodiment, the electronic device 800 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 800 may be or may include an intermediate product (e.g., a mobile phone main board) or module including a semiconductor device that may have one or more of the features and advantages discussed above.

According to embodiments, in a semiconductor device, conductive members may be used for both bonding substrates and enabling electrical connections between elements of the substrates. Advantageously, a size and/or a cost associated with the semiconductor device may be substantially minimized.

According to embodiments, a substrate and/or dielectric layer may effectively protect and/or insulate elements of a semiconductor device. Advantageously, satisfactory quality and/or reliability of the semiconductor device may be attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:
   preparing a first substrate;
   providing a first conductor, which is configured to electrically connect two elements associated with the first substrate;
   providing a second conductor on the first substrate, wherein the second conductor is electrically connected to the first conductor, wherein the second conductor is narrower than the first conductor in a direction parallel to the first substrate;
   preparing a second substrate;
   providing a third conductor, which is configured to electrically connect two elements associated with the second substrate;
   providing a fourth conductor on the second substrate, wherein the fourth conductor is electrically connected to the third conductor;
   providing a fifth conductor on the fourth conductor; and
   combining the fifth conductor with the second conductor through a eutectic bonding process.

2. The method of claim 1, comprising:
   forming a wafer structure, which comprises the first substrate, the first conductor, a third substrate, and a dielectric layer, wherein the dielectric layer is positioned between the first substrate and the third substrate, wherein the first conductor is positioned in the dielectric layer, and wherein the dielectric layer is combined with at least one of the first substrate and the third substrate through a fusion bonding process.

3. The method of claim 1 comprising:
   providing a sixth conductor, which extends through the first substrate and directly contacts the first conductor; and
   forming the second conductor to directly contact the sixth conductor.

4. The method of claim 3, wherein each of the sixth conductor and the first substrate is positioned between the first conductor and the second conductor, and wherein the second conductor is wider than the sixth conductor in the direction parallel to the first substrate.

5. The method of claim 1,
wherein the first substrate is positioned between the first conductor and the second conductor, and
wherein the third conductor is positioned between the second substrate and the fourth conductor.

6. The method of claim 5 comprising:
providing a polymer layer on the second substrate, wherein the second substrate is positioned between the third conductor and the polymer layer; and
providing a sixth conductor, which is electrically connected to the fourth conductor, is partially positioned in the polymer layer, and protrudes beyond the polymer layer.

7. The method of claim 6 comprising:
reducing a thickness of the second substrate before the providing the dielectric layer.

8. The method of claim 1, wherein the second conductor has a first ring structure, and wherein the fifth conductor has a second ring structure.

9. The method of claim 1, wherein a material of the fifth conductor is different from each of a material of the second conductor and a material of the fourth conductor.

10. The method of claim 9, wherein the material of the second conductor is identical to the material of the fourth conductor.

* * * * *